(12) United States Patent
Kuit et al.

(10) Patent No.: US 6,406,834 B1
(45) Date of Patent: Jun. 18, 2002

(54) LITHOGRAPHIC PROJECTION METHOD

(75) Inventors: Jan Jaap Kuit, Boxtel; Jan A. M. Smits, Heeze; Judocus M. D. Stoeldraijer, Hapert, all of (NL)

(73) Assignee: ASML Netherlands B.V., Veldhoven (NL)

(*) Notice: Subject to any disclaimer, the term of this patent is extended or adjusted under 35 U.S.C. 154(b) by 57 days.

(21) Appl. No.: 09/588,783

(22) Filed: Jun. 7, 2000

(30) Foreign Application Priority Data

Jun. 9, 1999 (EP) .......................................... 99201820

(51) Int. Cl.$^7$ ................................................ G03F 7/20
(52) U.S. Cl. ...................... 430/311; 430/322; 430/394; 430/396
(58) Field of Search ............................... 430/311, 322, 430/394, 396

(56) References Cited

U.S. PATENT DOCUMENTS 4,676,637 A * 6/1987 Uto ............................ 356/237

\* cited by examiner

*Primary Examiner*—Kathleen Duda
(74) *Attorney, Agent, or Firm*—Pillsbury Winthrop LLP

(57) ABSTRACT

A method of projecting an image onto a plurality of target areas on a substrate whereby use is made of a lithographic projection apparatus comprising:
  a radiation system for supplying a projection beam of radiation;
  a mask table provided with a mask holder for holding a mask;
  a substrate table provided with a substrate holder for holding a substrate;
  a projection system for imaging an irradiated portion of the mask onto a target area of the substrate,
whereby the substrate is to be irradiated with images from at least two different masks, characterized by the following steps:
  (a) providing a batch of substrates, each at least partially coated with a layer of radiation-sensitive material;
  (b) providing storage means for temporary storage of the batch;
  (c) providing a first mask on the mask table;
  (d) irradiating a first set of target areas of a first substrate with an image from the first mask, and then placing that substrate in the storage means;
  (e) repeating step (d) for each of the other substrates in the batch;
  (f) replacing the first mask by a second mask;
  (g) providing a primary substrate from the storage means on the substrate table and irradiating a second set of target areas of that substrate with an image from the second mask;
  (h) repeating step (g) for each of the other substrates stored in the storage means.

8 Claims, 1 Drawing Sheet

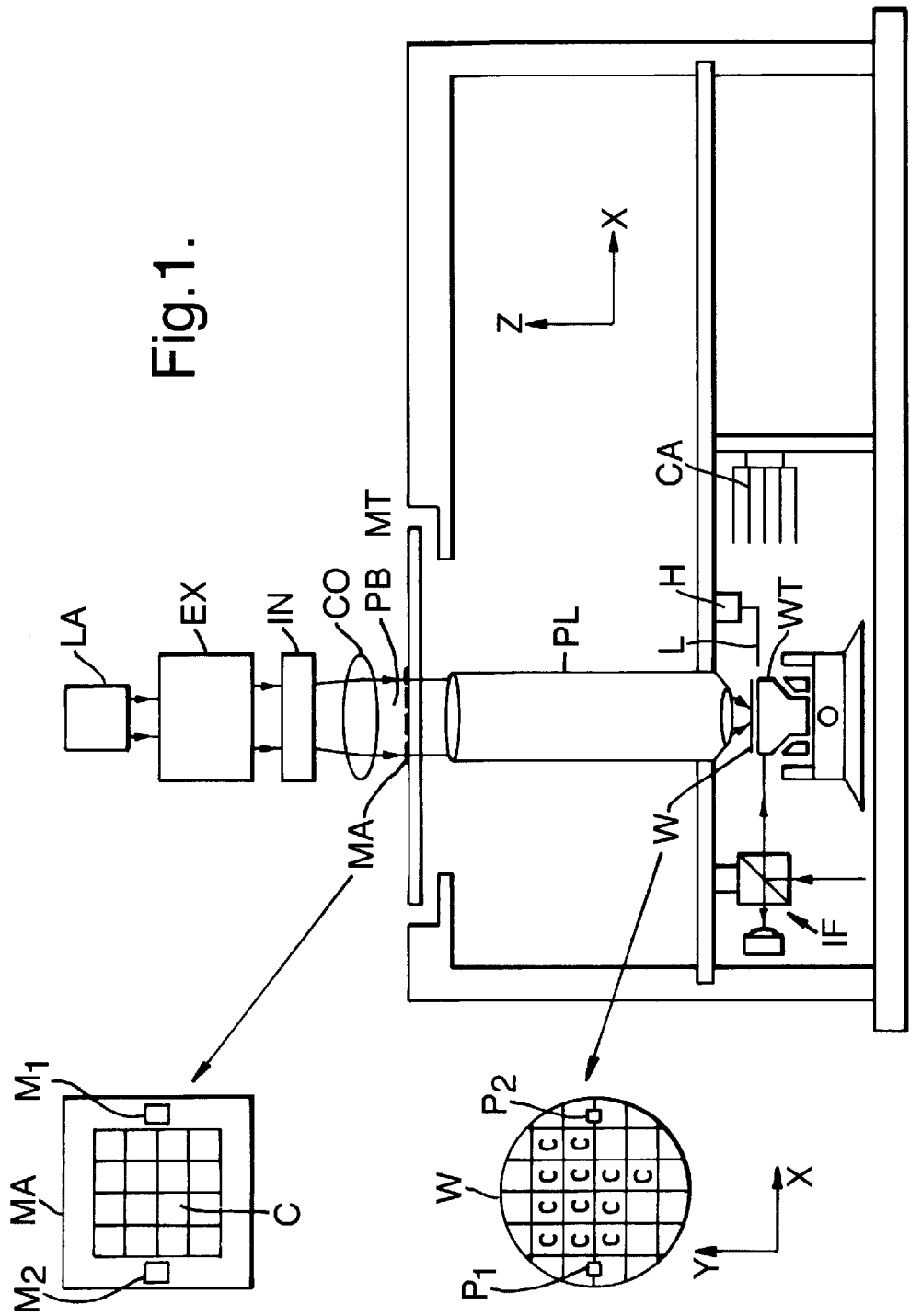

LITHOGRAPHIC PROJECTION METHOD

BACKGROUND OF THE INVENTION

1. Field of the Invention

The invention relates to a method of projecting an image onto a plurality of target areas on a substrate whereby use is made of a lithographic projection apparatus comprising:
- a radiation system for supplying a projection beam of radiation;
- a mask table provided with a mask holder for holding a mask;
- a substrate table provided with a substrate holder for holding a substrate;
- a projection system for imaging an irradiated portion of the mask onto a target area of the substrate, whereby the substrate is to be irradiated with images from at least two different masks.

2. Discussion of the Related Art

A lithographic projection apparatus as described in the opening paragraph can be used, for example, in the manufacture of integrated circuits (ICs). In such a case, the mask (reticle) may contain a circuit pattern corresponding to an individual layer of the IC, and this pattern can then be imaged onto a target area (comprising one or more dies) on a substrate (silicon wafer) which has been coated with a layer of radiation-sensitive material (resist). In general, a single wafer will contain a whole network of adjacent target areas that are successively irradiated through the reticle, one at a time. In one type of lithographic projection apparatus, each target area is irradiated by exposing the entire reticle pattern onto the target area at once; such an apparatus is commonly referred to as a waferstepper. In an alternative apparatus—which is commonly referred to as a step-and-scan apparatus—each target area is irradiated by progressively scanning the reticle pattern under the projection beam in a given reference direction (the "scanning" direction) while synchronously scanning the wafer table parallel or anti-parallel to this direction; since, in general, the projection system will have a magnification factor M (generally <1), the speed v at which the wafer table is scanned will be a factor M times that at which the reticle table is scanned. More information with regard to lithographic devices as here described can be gleaned from International Patent Application WO 97/33205.

Up to very recently, apparatus of this type contained a single mask table and a single substrate table. However, machines are now becoming available in which there are at least two independently movable substrate tables; see, for example, the multi-stage apparatus described in International Patent Applications WO 98/28665 and WO 98/40791. The basic operating principle behind such multi-stage apparatus is that, while a first substrate table is underneath the projection system so as to allow exposure of a first substrate located on that table, a second substrate table can run to a loading position, discharge an exposed substrate, pick up a new substrate, perform some initial metrology steps on the new substrate, and then stand by to transfer this new substrate to the exposure position underneath the projection system as soon as exposure of the first substrate is completed, whence the cycle repeats itself; in this manner, it is possible to achieve a substantially increased machine throughput, which in turn improves the cost of ownership of the machine.

Lithographic apparatus may employ various types of projection radiation, such as ultra-violet light (UV), extreme UV, X-rays, ion beams or electron beams, for example. Depending on the type of radiation used and the particular design requirements of the apparatus, the projection system may be refractive, reflective or catadioptric, for example, and may comprise vitreous components, grazing-incidence mirrors, selective multi-layer coatings, magnetic and/or electrostatic field lenses, etc; for simplicity, such components may be loosely referred to in this text, either singly or collectively, as a "lens". The apparatus may comprise components which are operated in vacuum, and are correspondingly vacuum-compatible. As mentioned in the previous paragraph, the apparatus may have more than one substrate table and/or mask table.

In many applications of a lithographic projection apparatus, each target area on a given substrate is exposed using a single mask (per layer). However, in certain applications, it is desirable to expose each target area to a patterned image from two or more different masks (both images being projected onto the same layer of radiation-sensitive material on the target area); within each target area, these distinct mask images may, for example, be projected in proximity to one another, in juxtaposition with one another, or in overlap (to a lesser or greater degree). Alternatively, one can expose a layer of radiation sensitive material on a substrate using two or more different masks in such a manner that different mask images are projected onto different target areas, such that each target area will be exposed with one mask image. However, a problem with such multiple-mask exposure is that it incurs a substantial time penalty per substrate. This is because, after exposure of the (relevant) target areas on a substrate using the first mask, the first mask has to be removed from the mask table, has to be replaced by a second mask, and then this second mask has to be aligned with the substrate. Even when employing the fastest and most sophisticated mask handling apparatus, this interchange procedure can be very time consuming. Another problem is that, after each mask change, the optics (e.g. masking shutters) in the radiation system (illuminator) will generally have to be adjusted. Not only does this incur a further time penalty, but it also necessitates much more frequent use of the actuators used to adjust the optics, leading to problems of early wear.

SUMMARY OF THE INVENTION

It is an object of the invention to alleviate these problems. In particular, it is an object of the invention to provide a multiple-mask exposure method that allows a significantly greater machine throughput than known methods.

These and other objects are achieved in a method as specified in the opening paragraph, characterized by the following steps:
   (a) providing a batch of substrates, each at least partially coated with a layer of radiation-sensitive material;
   (b) providing storage means for temporary storage of the batch;
   (c) providing a first mask on the mask table;
   (d) irradiating a first set of target areas of a first substrate with an image from the first mask, and then placing that substrate in the storage means;
   (e) repeating step (d) for each of the other substrates in the batch;
   (f) replacing the first mask by a second mask;
   (g) providing a primary substrate from the storage means on the substrate table and irradiating a second set of target areas of that substrate with an image from the second mask;

(h) repeating step (g) for each of the other substrates stored in the storage means.

The term "batch" as used in the context of the present invention should be interpreted as referring to a set of substrates that are to be processed according to a given "recipe", e.g. in relation to a particular layout or combination of target areas or die types on the available substrate area. Such a "batch" of substrates is offered to the lithographic projection apparatus in one go. In the event that the total number of substrates to be processed according to the said recipe is greater than the size of the said batch, then many such batches may be consecutively offered to the apparatus, until the relevant recipe set is exhausted.

The method according to the invention has the advantage that a mask interchange only has to occur once per batch instead of one per substrate, so that there is less time-overhead per substrate for each such interchange, and so that there is less wear of adjustable optical components in the radiation system. The wear of the masks and the mask handling system will also generally decrease when the method according to the invention is used. The inventors arrived at the invention only after they had discovered that, contrary to what one might think, the radiation-sensitive layer on a given substrate does not degenerate significantly while the substrate is waiting in the storage means between exposure to a first and a second mask, at least not for batches of a reasonable size (e.g. of the order of 25 to 50 substrates). Such degeneration might be expected to occur on the basis of viscous creep, for example.

With regard to step (d), it should be noted that the last substrate to be exposed to the first mask need not be placed in the storage means; instead, it can be left on the substrate table during performance of step (f). In that case, the primary substrate to be exposed in step (g) is already on the substrate table, and thus does not have to be retrieved from the storage means. This situation should be regarded as falling within the scope of claim 1. On the other hand, it may be advantageous to choose the sequence in which substrates are exposed from the second mask so as to be equal to the sequence in which substrates are exposed from the first mask, because, for each substrate in the batch, the delay between both exposures will then be substantially equal, which gives similar processing circumstances for all the substrates. In any case, it should be noted that the primary substrate in step (g) may or may not be the same as the first substrate in step (d): such is a matter of choice and/or requirement in a particular application.

In a particular embodiment of the method according to the invention, the storage means comprise a cassette having slots into which the various substrates can be placed in stacked arrangement. Such cassettes are commonly available for storing and transporting semiconductor substrates (wafers), and are often employed in so-called FOUP or SMIF devices in the industry. An advantage of using such a cassette is that it allows storage of a relatively large number of substrates in a relatively compact area.

In a particular embodiment of the invention, the storage means are located within the lithographic projection apparatus, in proximity (e.g. within the order of 0.5–1.0 meters) to the substrate table and a substrate handler that can be used for transferring each substrate between said substrate table and said storage means. An advantage of such an arrangement is that the time required to load/unload and transfer substrates between the substrate table and the storage means is minimal, with the attendant advantageous effect on batch processing time.

The batch of substrates may be provided to the substrate table with the aid of a wafer track, for example, which spin-coats the substrates with radiation-sensitive material before they are transferred into the lithographic projection apparatus. In a particular embodiment of such a wafer track, the storage means are provided within the track, and the track is equipped with transport means that can be used for transferring a substrate between the substrate handler (of the lithographic projection apparatus) and the said storage means. The batch of resist-coated substrates may also be provided in a cassette and loaded via a substrate entry port; such a cassette can, if desired, double up as the storage means, or separate storage means can be employed.

In a manufacturing process using a lithographic projection apparatus according to the invention, a pattern in a mask is imaged onto a substrate which is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference has been made hereabove to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

BRIEF DESCRIPTION OF THE DRAWING

The invention and its attendant advantages will be further elucidated with the aid of an exemplary Embodiment and the accompanying schematic FIG. 1 schematically depicts a lithographic projection apparatus suitable for use with a method according to the invention.

DETAILED DESCRIPTION OF THE EMBODIMENTS

First Embodiment

The accompanying FIGURE schematically depicts a lithographic projection apparatus in which the method according to the invention can be implemented. The apparatus comprises:
   a radiation system LA, Ex, IN, CO for supplying a projection beam PB of radiation;

a mask table MT provided with a mask holder for holding a mask MA (e.g. a reticle);

a substrate table WT provided with a substrate holder for holding a substrate W (e.g. a resist-coated silicon wafer);

a projection system PL for imaging an irradiated portion of the mask MA onto a target area C of the substrate W.

In this case, the depicted apparatus comprises refractive components. However, it may alternatively comprise one or more reflective components.

The radiation system comprises a source LA (e.g. a Hg lamp or excimer laser, a thermionic gun or ion source, or secondary source from a wiggler/undulator situated around the path of an electron beam in a storage ring or synchrotron) which produces a beam of radiation. This beam is passed along various optical components in an illuminator system—e.g. beam shaping optics Ex, an integrator IN and a condensor CO—so that the resultant beam PB has a desired shape and intensity distribution in its cross-section.

The beam PB subsequently intercepts the mask MA which is held in a mask holder on a mask table MT. Having passed through the mask MA, the beam PB passes through the projection system PL, which focuses the beam PB onto a target area C of the substrate W. With the aid of the interferometric displacement and measuring means IF, the substrate table WT can be moved accurately, e.g. so as to position different target areas C in the path of the beam PB. Similarly, the mask table MT can be positioned very accurately with respect to the beam PB. In general, movement of the mask table MT and the substrate table WT will be realized with the aid of a long stroke module (course positioning) and a short stroke module (fine positioning), which are not explicitly depicted in FIG. 1. In the case of a waferstepper, as opposed to a step-and-scan device, the mask table MT may only be moved with a short stroke module, or may be just fixed.

The depicted apparatus can be used in two different modes:

In step mode, the mask table MT is fixed, and an entire mask image is projected at once (i.e. a single "flash") onto a target area C. The substrate table WT is then shifted in the x and/or y directions so that a different target area C can be irradiated by the (stationary) beam PB;

In scan mode, essentially the same scenario applies, except that a given target area C is not exposed in a single "flash". Instead, the mask table MT is movable in a given direction (the so-called "scan direction", e.g. the x direction) with a speed $\xi$, so that the projection beam PB is caused to scan over a mask image; concurrently, the substrate table WT is simultaneously moved in the same or opposite direction at a speed V=Mv, in which M is the magnification of the projection system PL (typically, M=¼ or ⅕). In this manner, a relatively large target area C can be exposed, without having to compromise on resolution.

According to the invention, storage means CA are placed in proximity to the substrate table WT; as described above, such storage means CA may take the form of a cassette, for example, containing slots into which a plurality of substrates can be inserted. Substrates can be transferred between the substrate table WT and the storage means CA using a substrate handler H that can hold substrates upon its gripper L. The substrate handler H will move to the substrate table WT and pick up the substrate W with its gripper L. Subsequently the substrate handler H will move to the storage means CA and will insert the substrate in one of the slots provided in the storage means CA. The substrate handler H may be equipped to move the gripper L up and down relative the slots provided in the storage means CA, such that a substrate held by the gripper L can be inserted into, and removed from, a particular slot of the storage means CA. Alternatively, the storage means CA may be provided with an elevator mechanism for moving the slots of the storage means CA up and down relative the gripper L, such that a particular slot is elevated to a particular position in which the gripper L can insert a substrate into, and remove a substrate from, said particular slot. Many suitable types of substrate handlers H are well known in the art. More information with regard to said substrate handler H may be gleaned from European Patent Application 00302997.2.

Using a mask handling robot, different masks MA can be transferred onto and off of the mask table MT. A mask handling robot is described in more detail in European Patent Application 00303142.4.

According to the method of the current invention, a first mask MA_1 is placed on the mask table MT. Various target areas C on a first resist-coated substrate W_1 are exposed to a pattern on this mask, through the projection system PL. The (fully) exposed substrate W_1 is then transferred to the storage means CA, and a second substrate W_2 is placed on the table WT. After this second substrate W_2 has been exposed, it too is transferred to the storage means, and a third substrate W_3 is placed on the table WT. This procedure is continued until the N-th substrate W_N in a batch of N substrates has been exposed.

Leaving the N-th substrate on the table WT, the mask MA_1 is now replaced by a second mask MA-2. Various target areas C on substrate W_N are exposed to a pattern on this second mask, through the projection system PL. The (fully) exposed substrate W_N can now be removed for further processing; alternatively, if a third mask-exposure is to occur in the same layer of radiation-sensitive material, then the substrate W_N is returned to the storage means (to await batch-exposure to the third mask). The next substrate W_N-1 is now retrieved from the storage means CA and placed on the table WT. After this substrate W_N-1 has been exposed, it too is removed or transferred back to the storage means CA, and the next substrate W_N-2 is placed on the table WT. This procedure is continued until all N substrates in the batch have been exposed to all employed masks.

It may be advantageous to choose the sequence in which substrates are exposed from the second mask so as to be equal to the sequence in which substrates are exposed from the first mask, because, for each substrate in the batch, the delay between both exposures will then be substantially equal for all the substrates in the batch which gives similar process circumstances for all the substrates. After one batch of substrates has received the desired multiple-mask exposure, it can be removed from the lithographic projection apparatus for further processing, and replaced by a new batch of substrates, which can be exposed as described above.

What is claimed is:

1. A method of projecting an image onto a plurality of target areas on a substrate with a lithographic projection apparatus, comprising:
    (a) providing a batch of substrates, each at least partially coated with a layer of radiation-sensitive material;
    (b) providing a storage assembly constructed and arranged to provide temporary storage of the batch;
    (c) providing a first mask on a mask table;
    (d) irradiating a first set of target areas in the layer of radiation-sensitive material of a substrate with an image from the first mask, and then placing the substrate in the storage assembly;

(e) repeating said irradiating a first set of target areas in the layer of radiation-sensitive material for each of the other substrates in the batch;

(f) replacing the first mask with a second mask;

(g) providing a substrate from the storage assembly on the substrate table and irradiating a second set of target areas in the layer of radiation-sensitive material of that substrate with an image from the second mask;

(h) repeating said providing a substrate from the storage assembly and irradiating a second set of target areas in the layer of radiation-sensitive material for each of the other substrates stored in the storage assembly.

2. A method according to claim 1, wherein said storage assembly comprises a cassette having slots into which various substrates can be placed in stacked arrangement.

3. A method according to claim 1, wherein said lithographic projection apparatus further comprises a substrate handler constructed and arranged to transfer a substrate between a substrate table and said storage assembly.

4. A method according to claim 1, wherein said batch of substrates is provided by a wafer track.

5. A method according to claim 4 wherein said lithographic projection apparatus further comprises a substrate handler constructed and arranged to transfer a substrate between a substrate table and said storage assembly, wherein said storage assembly is provided in the wafer track, and the wafer track comprises a transport device constructed and arranged to transfer a substrate between the substrate handler and the storage assembly.

6. A method according to claim 1, wherein said batch of substrates is provided in a cassette having slots in which the various substrates are located in stacked arrangement.

7. A method according to claim 6, wherein said cassette is also used as the storage assembly.

8. A method according to claim 1 wherein said first set of target areas is equal to said second set of target areas.

* * * * *